United States Patent
Miyake et al.

(10) Patent No.: US 7,589,546 B2
(45) Date of Patent: Sep. 15, 2009

(54) INSPECTION APPARATUS AND METHOD FOR SEMICONDUCTOR IC

(75) Inventors: Naomi Miyake, Osaka (JP); Yoshiro Nakata, Kyoto (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 11/806,766

(22) Filed: Jun. 4, 2007

(65) Prior Publication Data
US 2007/0278662 A1    Dec. 6, 2007

(30) Foreign Application Priority Data

Jun. 5, 2006 (JP) ............................. 2006-155508
Mar. 8, 2007 (JP) ............................. 2007-057930

(51) Int. Cl.
*G01R 31/02* (2006.01)
*G01R 31/26* (2006.01)

(52) U.S. Cl. ................. 324/760; 324/765; 324/158.1

(58) Field of Classification Search ......... 324/754–765; 438/14–17
See application file for complete search history.

(56) References Cited

U.S. PATENT DOCUMENTS

| | | | |
|---|---|---|---|
| 5,568,054 A * | 10/1996 | Iino et al. ................... | 324/760 |
| 6,400,175 B2 * | 6/2002 | Nakata et al. ............... | 324/765 |
| 6,441,637 B1 * | 8/2002 | Neeb .......................... | 324/771 |
| 6,781,400 B2 * | 8/2004 | Nakata et al. ............... | 324/765 |
| 6,850,083 B2 * | 2/2005 | Leshnovolsky et al. ..... | 324/760 |
| 6,943,576 B2 * | 9/2005 | Byun et al. .................. | 324/765 |

FOREIGN PATENT DOCUMENTS

JP       11-87442      3/1999

* cited by examiner

*Primary Examiner*—Ha Tran T Nguyen
*Assistant Examiner*—Emily Y Chan
(74) *Attorney, Agent, or Firm*—Steptoe & Johnson LLP

(57) ABSTRACT

The connection between a PTC element $22a$ corresponding to each semiconductor IC $11a$ and a power-supply line $25a$ is performed via a relay, a high voltage is supplied to the power-supply line $25a$ by sequentially turning on the relays, and a high voltage is supplied to each PTC element $22a$ in order, whereby it is possible to trip beforehand a PTC element $22a$ connected to a DC-defective semiconductor IC $11a$. In this state, wafer level burn-in is performed together, which enables the PTC element $22a$ to be positively tripped during the burn-in for the DC defect of the semiconductor IC $11a$, with the result that it is possible to increase the reliability of the burn-in.

5 Claims, 7 Drawing Sheets

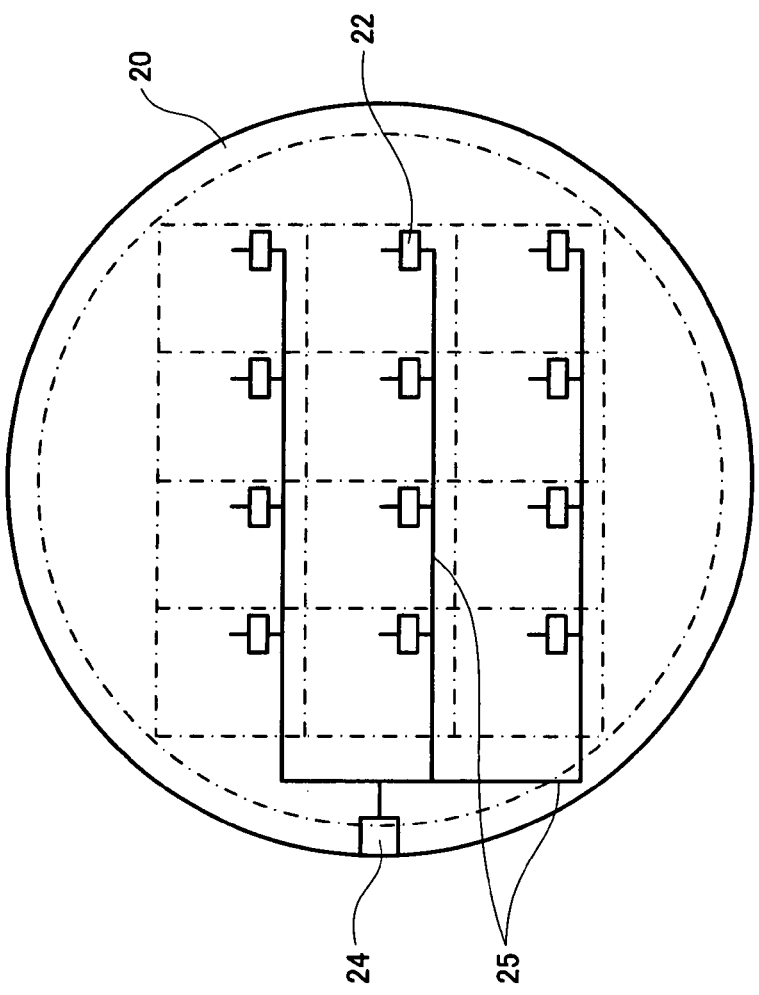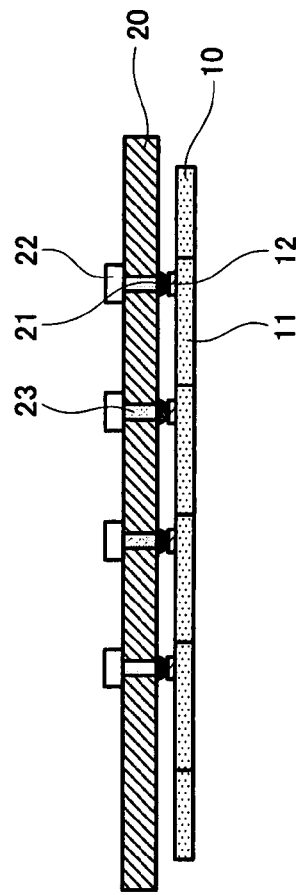
FIG. 7A PRIOR ART
FIG. 7B PRIOR ART

INSPECTION APPARATUS AND METHOD FOR SEMICONDUCTOR IC

FIELD OF THE INVENTION

The present invention relates to a semiconductor inspection apparatus that performs burn-in using a wafer level test probe or burn-in of wafer using a burn-in board and a method of inspecting a semiconductor IC.

BACKGROUND OF THE INVENTION

In order to screen defective products occurring at the initial stage of manufacturing of semiconductor devices or wafers, accelerated tests have hitherto been performed by causing semiconductor devices and wafers to work under high-temperature, high-voltage conditions. These tests are called burn-in. In recent years, a technique for performing burn-in at the wafer level (hereinafter referred to as wafer-level burn-in) has been frequently carried out. In wafer-level burn-in, the inspection is performed by inputting a high voltage and signals to the power-supply electrode of the device and a plurality of input/output electrodes, respectively.

Usually, in the case of a semiconductor wafer, the possibility that a plurality of devices fabricated on the wafer are all conforming products is low, and both defective products and conforming products are mixed on the wafer. In wafer-level burn-in, the inspection is often carried out by applying stress to only conforming products and insulating nonconforming products so that they do not work.

The construction of a probe card (a semiconductor inspection apparatus) in conventional wafer-level burn-in will be described here with reference to FIGS. 7A and 7B.

FIG. 7A is a plan view that shows the rear surface of a conventional probe card, and shows the appearance of a surface of the probe card opposite to the surface that comes into contact with each semiconductor IC 11. FIG. 7B is a sectional view that shows the cross-sectional structure of the conventional probe card.

As shown in FIG. 7B, a plurality of semiconductor ICs 11 are formed on a semiconductor wafer 10, and an inspection electrode 12 is formed on each of the semiconductor ICs 11. Although usually a plurality of inspection electrodes 12 are formed on each of the semiconductor ICs 11, for the sake of simplicity of illustration, FIG. 7B shows a case where one inspection electrode 12 is formed on each of the semiconductor IC 11. The alternate long and short dash lines in FIG. 7A indicate the positional relationship of the semiconductor ICs 11 when a probe card is placed on the semiconductor wafer 10 during the inspection.

As shown in FIGS. 7A and 7B, a probe terminal 21 corresponding to each of the inspection electrodes 12 of the semiconductor IC 11 is formed on a surface of a card body 20 constituting the probe card, and a PTC (positive temperature coefficient) element 22, which is a current breaking circuit performing breaking operation according to the amount of current, is formed in an area corresponding to the probe terminal 21 on the rear surface of the card body 20. And in an area of the card body 20 where the probe terminal 21 is formed, a contact 23 that pierces through the card body 20 in the front and rear direction is formed. The front surface side of the contact card 23 is connected to the probe terminal 21, and the rear surface side of the contact 23 is connected to the PTC element 22.

An external electrode 24 to which a voltage is applied from an external device is formed in a peripheral edge portion of the rear surface of the card body 20, and on the rear surface of the card body 20, a common voltage supply line 25 that connects the external electrode 24 and each of the PTC elements 22 extends in a branching manner. As a result of this, when a voltage is applied to the external electrode 24, the applied voltage is applied to each of the probe elements 21 via the common voltage supply line 25, the PTC elements 22 and the contacts 23. Incidentally, the common voltage supply line 25 may be constructed in such a manner that the common voltage supply line 25 is connected, in a shared manner, to the PTC elements 22 corresponding to the semiconductor ICs 11 for each row and column on the semiconductor wafer 10 by a plurality of common voltage supply lines 25 branching off from the external electrode 24. The common voltage supply line 25 may also be a power-supply voltage supply line for applying a power-supply voltage or a grounding-voltage supply line for applying a grounding voltage.

A polymer-based PTC element, a ceramic-based PTC element formed from barium titanate ($BaTiO_3$) and the like are used as the PTC element 22.

Incidentally, the polymer-based PTC element is a resistance element in which conductive carbon and an insulating polymer, such as polyolefin and fluororesin, are mixed, and in a normal state the carbon dispersed in the polymer forms a large number of conducting paths. Therefore, the polymer-based PTC element has a low specific resistance value. However, when the temperature of the polymer-based PTC element is gradually raised from the normal state, the conducting paths of the carbon are gradually cut and the polymer-based PTC element exhibits gentle PTC characteristics, because the coefficient of thermal expansion of the polymer is higher than the coefficient of thermal expansion of the carbon. And when a prescribed temperature is exceeded, the PTC effect appears abruptly. That is, because volume changes resulting from the melting of the polymer, which are as high as several tens percent, cut the conducting paths of the carbon one by one, the resistance value increases by several orders of magnitude, for example, on the order of five orders of magnitude.

In the case of the ceramic-based PTC element, it is possible to select a prescribed temperature at which the PTC effect exhibits itself by adjusting the amount of an impurity added. For example, in a case of a ceramic-based PTC element formed from barium titanate, by adding Pb as an impurity, it is possible to cause the temperature at which the PTC effect exhibits itself to shift to the high-temperature side. The temperature at which the PTC effect exhibits itself shifts to the high-temperature side with increasing amount of Pb added.

The phenomenon in which the resistance value of the PTC element becomes very high compared to that in a steady state due to the flow of a large amount of current in the PTC element or due to a temperature rise of the PTC element is called a trip. In a steady state the resistance value of the PTC element is stable at a very low value with respect to a load. However, when the amount of a flowing current exceeds a standard (a trip current) determined by the characteristics of the PTC element, the resistance of the PTC element increases due to self-heating and the current that flows through the PTC element is limited to a very small amount. Once the PTC element comes to a trip state, the PTC element becomes stable in the condition in which the resistance value has increased and, therefore, the PTC element continues to maintain the trip state. And the PTC element returns automatically to the steady state when the power source is shut off and the PTC element temperature returns to the initial condition or when the voltage of a circuit becomes sufficiently low (when the calorific value of the PTC element becomes small compared to its heat release).

As described above, because a probe card used for wafer-level burn-in is provided with a voltage supply line that supplies a voltage to each semiconductor IC and PTC elements added on the power supply line so as to correspond to each of the semiconductor ICs, a large amount of current flows through DC-defective semiconductor ICs during wafer-level burn-in. Therefore, the resistance of the PTC element increases and it is possible to insulate the semiconductor ICs.

DISCLOSURE OF THE INVENTION

In recent years, the scale down of the process has advanced rapidly and in association with this trend the dissipation power of semiconductor ICs has increased greatly. A power-supply current (an off-leak current) at an operation stop tends to increase exponentially with respect to temperature, and the increase in off-leak current due to scale down has posed a serious problem under the high-temperature, high-voltage conditions of burn-in.

Usually, in the case of a semiconductor wafer, the possibility that a plurality of devices fabricated on the wafer are all conforming products is low, and both defective products and conforming products are mixed on the wafer. In wafer-level burn-in, the inspection is often carried out by applying stress to only conforming products and insulating defective products so that they do not work. In particular, with respect to DC defects (in which a large amount of current flows), in a case where the power supply is connected in a shared manner by a plurality of semiconductor ICs, insulation is essential. However, this has the problem that it is difficult to find out a difference between an increase in off-leak current and a DC defect as described above.

Incidentally, in the semiconductor inspection apparatus of the above-described conventional technique, the PTC elements are connected in parallel to the power-supply line or the grounding common line.

In this arrangement, the current supplied to each of the PTC elements becomes insufficient due to the disturbance of the semiconductor ICs with a large off-leak current. Therefore, this arrangement had the problem that it is impossible to insulate the semiconductor ICs by causing a trip current to flow positively through the PTC elements in DC-defective products.

The semiconductor inspection apparatus and the inspection method of semiconductor ICs according to the present invention solve the above-described conventional problems, and an object of the invention is to ensure that PTC elements are positively tripped for DC defects of semiconductor ICs and to increase the reliability of wafer-level burn-in and many packages burn-in.

To achieve the above-described object, the semiconductor inspection apparatus of the present invention is a semiconductor inspection apparatus that performs wafer level burn-in for a plurality of semiconductor ICs, which have a plurality of electrodes that input and output a signal or a power-supply voltage or a grounding voltage and are formed on a wafer, comprising: a plurality of probes that perform inspection by being connected to each of all the electrodes that all the semiconductor ICs have; a plurality of signal interconnects for inputting and outputting, via the probe, the signal to and from the signal electrode that each of the semiconductor ICs has; a power-supply interconnect that supplies, via the probe, the power-supply voltage to all of the power-supply electrodes that each of the semiconductor ICs has; a grounding interconnect that supplies, via the probe, the grounding voltage to all of the grounding electrodes that each of the semiconductor ICs has; a relay that is inserted between the power-supply interconnect and all or at least one of the power-supply electrodes; and a PTC element that is inserted between the relay and the power-supply electrode, wherein for each of the semiconductor ICs in order, a high voltage is applied, with the relay brought into a connected condition, and the burn-in is performed, with the PTC element tripped for all of the semiconductor ICs that have been proven to be defective products.

In the semiconductor inspection apparatus of the present invention, a signal relay is inserted also between the signal interconnect and each of the signal electrodes, and a control signal of the signal relay is used as an output signal of the PTC element connected to the same semiconductor IC.

Also, the semiconductor inspection apparatus of the present invention is a semiconductor inspection apparatus that performs wafer level burn-in for a plurality of semiconductor ICs, which have a plurality of electrodes that input and output a signal or a power-supply voltage or a grounding voltage and are formed on a wafer, comprising: a plurality of probes that perform inspection by being connected to each of all the electrodes that all the semiconductor ICs have; a plurality of signal interconnects for inputting and outputting, via the probe, the signal to and from the signal electrode that each of the semiconductor ICs has; a plurality of power-supply interconnects that supply, via the probe, a power-supply voltage corresponding to each of the power-supply electrodes of the same voltage that each of the semiconductor ICs has; a grounding interconnect that supplies, via the probe, the grounding voltage to all of the grounding electrodes that each of the semiconductor ICs has; a relay that is inserted between the power-supply interconnect and all or at least one of the power-supply electrodes; and a PTC element that is inserted between the relay and the power-supply electrode, wherein a control signal of the relay connected to the power-supply electrode corresponding to one power-supply voltage is input from the outside, an output signal of the PTC element corresponding to the one power-supply voltage is input as a control signal of the relay connected to the power-supply electrode corresponding to other power-supply voltage, for each of the semiconductor ICs in order, a high voltage is applied, with the relay that is connected to the power-supply electrode corresponding to the one power-supply voltage brought into a connected condition, and the burn-in is performed, with the PTC element tripped for all of the semiconductor ICs that have been proven to be defective products.

Furthermore, the semiconductor IC inspection method of the present invention is a semiconductor IC inspection method for performing wafer level burn-in for a plurality of semiconductor ICs, with power supply stopped to a semiconductor IC, which is a defective product, by a PTC element, comprising the steps of: supplying power to the semiconductor ICs singly or in a plurality of numbers at a time in order and tripping the PTC element connected to the semiconductor IC, which is a defective product; and performing wafer level burn-in for all of the semiconductor ICs, with the PTC element connected to the semiconductor IC tripped, wherein a voltage lower than a burn-in voltage is used as a voltage during the power supply.

In the semiconductor IC inspection method of the present invention, the voltage during the power supply is adjusted by a current of the power supply that supplies the voltage.

In the semiconductor IC inspection method of the present invention, the input of a signal to the semiconductor IC is controlled by using an output signal of the PTC element.

In the semiconductor IC inspection method of the present invention, the power supply is performed at a temperature lower than that during burn-in.

In the semiconductor IC inspection method of the present invention, in a case where the semiconductor IC has a plurality of power supplies, by use of an output signal to a PTC element corresponding to one power-supply voltage, the application of a power-supply voltage to a PTC element corresponding to another power-supply voltage is controlled.

In the semiconductor IC inspection method of the present invention, the burn-in is wafer-level burn-in that is performed together for the plurality of semiconductor ICs formed on a wafer.

In the semiconductor IC inspection method of the present invention, the semiconductor IC is a packaged semiconductor IC mounted on a burn-in board and the burn-in is package burn-in that is performed together for the plurality of semiconductor ICs mounted on the burn-in board.

Furthermore, the semiconductor inspection apparatus of the present invention is a semiconductor inspection apparatus on which a plurality of semiconductor ICs having a plurality of electrodes that input and output a signal or a power-supply voltage or a grounding voltage are mounted, and which performs wafer level burn-in for the semiconductor ICs, comprising: a plurality of board interconnect terminals for performing inspection by being connected to each of all the electrodes that all the semiconductor ICs have; a plurality of signal interconnects for inputting and outputting the signal, via the board interconnect terminal, to and from the signal electrodes that each of the semiconductor ICs has; a power-supply interconnect that supplies the power-supply voltage, via the board interconnect terminal, to all the power-supply electrodes that each of the semiconductor ICs has; a grounding interconnect that supplies the grounding voltage, via the board interconnect terminal, to all the grounding electrodes that each of the semiconductor ICs has; a relay that is inserted between the power-supply interconnect and all or at least one of the power-supply electrodes; and a PTC element that is inserted between the relay and the power-supply electrode, wherein for each of the semiconductor ICs in order, a high voltage is applied, with the relay brought into a connected condition, and the burn-in is performed, with the PTC element tripped for all of the semiconductor ICs that have been proven to be defective products.

In the semiconductor inspection apparatus of the present invention, a signal relay is inserted also between the signal interconnect and each of the signal electrodes, and a control signal of the signal relay is used as an output signal of the PTC element connected to the same semiconductor IC.

BRIEF DESCRIPTION OF THE DRAWINGS

FIG. 7A is a plan view that shows the rear surface of a conventional probe card; and FIG. 7B is a sectional view that shows the cross-sectional structure of a conventional probe card.

DESCRIPTION OF THE EMBODIMENT(S)

Embodiments of a semiconductor inspection apparatus and an semiconductor IC inspection method according to the present invention will be described in detail on the basis of the drawings.

Embodiment 1

Figure 1:
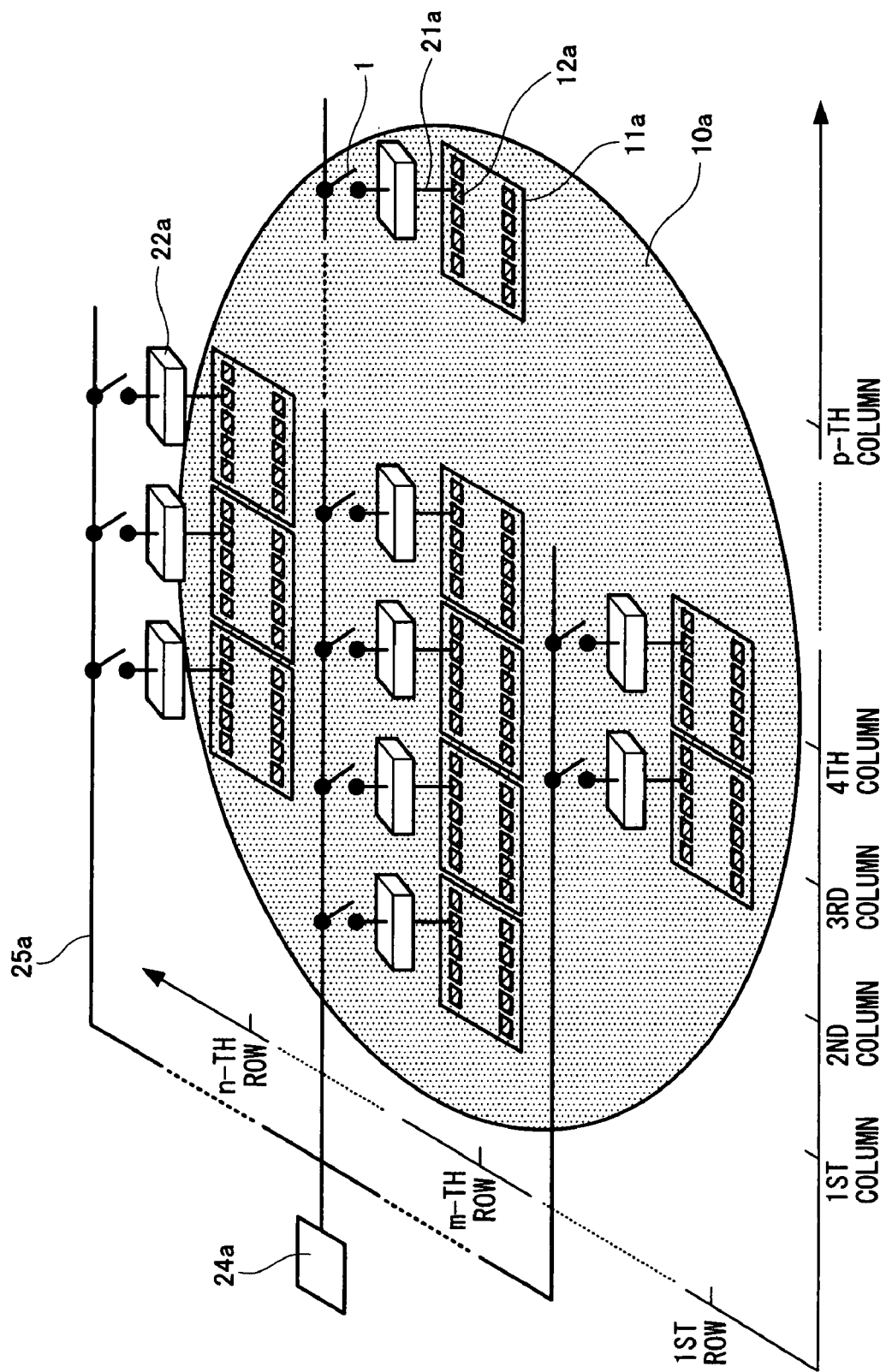
FIG. 1 is a diagram that shows the connected condition of a semiconductor inspection apparatus in Embodiment 1 of the present invention.

Embodiment 1 according to the present invention relates to a PTC element and a relay and will be described in detail by using FIG. 1. FIG. 1 is a diagram that shows the connected condition of a semiconductor inspection apparatus in Embodiment 1 of the present invention.

In FIG. 1, the reference numeral 22a denotes a PTC element, the reference numeral 24a denotes an external electrode, and the reference numeral 25a denotes a common voltage or current supply line. This arrangement is the same as the plane structure of the rear surface of a probe card in a conventional technique shown in FIG. 7. The reference numeral 10a denotes a semiconductor wafer, the reference numeral 11a denotes a semiconductor IC, and the reference numeral 12a denotes an inspection power-supply electrode. And the reference numeral 1 denotes a relay or relay circuit according to the present invention.

The relay or relay circuit 1 is connected in parallel to the common voltage or current supply line 25a, and the PTC element 22a is connected in series to the relay or relay circuit 1 and connected to the inspection power-supply electrode 12a via each probe terminal 21a. In FIG. 1, the relay or relay circuit 1 is connected between the PTC element 22a and the voltage or current supply line 25a. However, the relay or relay circuit 1 may also be connected between the PTC element 22a and each probe terminal 21a.

In the example of FIG. 1, the common voltage or current supply line 25a is supplied from the external electrode 24a and branches into a plurality of supply lines connected to the semiconductor IC 11a in each row.

Incidentally, it is not always necessary that the supply of voltage or current to the semiconductor IC 11a be arranged as shown in FIG. 1. For example, it is also possible that abutment is effected at a terminal of the PTC element 22a or an interconnect layer of a board on which the PTC element 22a is mounted (the voltage or current supply line 25a is also formed in this board).

The above description was given of an arrangement in which the relay or relay circuit 1 is provided for each of the inspection power-supply electrodes 12a and can be on-off controlled. However, it is not always necessary that the relay or relay circuit 1 and the PTC element 22a are formed for all of the inspection power-supply electrodes 12a, and the arrangement may be such that the relay or relay circuit 1 and the PTC element 22a are formed in a minimum number of inspection power-supply electrodes 12a required for stopping operation.

A semiconductor IC inspection method in the present invention will be described below.

First, before wafer-level burn-in is performed, a PTC element 22a connected to a DC-defective semiconductor IC 11a is tripped.

At the start, with attention paid to the m-th row in FIG. 1, the relay or relay circuit 1 in the m-th row, first column is turned on.

When in this state a voltage is applied to the external electrode 24a from an unillustrated burn-in apparatus in order to start wafer-level burn-in, the applied voltage is applied to the inspection power-supply electrode 12a of the semiconductor IC 11a in the m-th row, first column via the common voltage or current supply line 25a, the relay or relay circuit 1, the PTC element 22a and the probe terminal 21a.

At this time, if a DC defect is present in the semiconductor IC 11a, an abnormally large amount of current flows. Therefore, a large amount of current flows also through the connected PTC element 22a and the temperature of this PTC element 22a rises to a high level. The PTC element 22a comes to a trip state and the resistance value thereof rises remarkably. As a result, the voltage is not applied to the DC-defective semiconductor IC 11a any more. By contrast, when the semiconductor IC 11a is a conforming product, the PTC element 22a maintains the connection at low resistance and it is possible to apply the voltage, with the relay or relay circuit 1 kept on in a normal condition.

Next, the relay in the m-th row, second column is turned on.

In this state a voltage is applied to the external electrode 24a. If an abnormally large amount of current flows through the semiconductor IC 11a due to a DC defect and the like, a large amount of current flows also through the PTC element 22a, the temperature of this PTC element 22a rises to a high level and the resistance value of the PTC element 22a increases remarkably. As a result, the voltage is not applied to the defective semiconductor IC 11a any more. When the semiconductor IC 11a is a conforming product, the PTC element 22a maintains the connection at low resistance and it is possible to apply the voltage, with the relay or relay circuit 1 kept on in a normal condition.

By similarly carrying out the wafer-level burn-in to the p-th column, the semiconductor ICs 11a can be checked for a DC defect. The trip state is maintained until the temperature of the PTC element 22a drops, and when in this state the wafer-level burn-in is carried out, defective semiconductor ICs 11a in the whole m-th row, through which an abnormally large current flows, can be shut off from the common voltage or current supply line.

Furthermore, by similarly performing voltage application also to each row, it is possible to bring the PTC elements 22a of semiconductor ICs 11a, which are DC-defective in the whole semiconductor wafer 10a, into a trip state.

It is also possible to stop the power supply to a DC-defective semiconductor IC 11a only by use of a relay without using the PTC element 22a. However, even when a DC-defective semiconductor IC 11a could be detected, it is necessary to disconnect the relay for the DC-defective semiconductor IC 11a during wafer-level burn-in. On the other hand, because the PTC element 22a is connected, the voltage is not applied to the DC-defective semiconductor IC 11a any more without the need to disconnect the relay while the PTC element 22a is in a trip state.

With conventional semiconductor inspection apparatus, in a case where there are many DC-defective semiconductor ICs 11a, when a voltage is applied at a time to the whole semiconductor wafer 10a or the whole row, the current is sometimes insufficient for tripping the PTC element 22a of each of the DC-defective semiconductor ICs 11a. In the present invention, however, a voltage is applied to the semiconductor ICs 11a one by one and the PTC element 22a of a DC-defective semiconductor IC 11a is tripped, whereby it is possible to reduce the supply capacity of the common power supply for tripping the PTC element. Instead of applying a voltage to the semiconductor ICs 11a one by one, it is also possible to apply a voltage to each of a plurality of semiconductor ICs 11a within the range of the supply capacity of the common power supply for tripping the PTC elements 22a.

For example, in a case where the common voltage or current supply line 25a is wired in such a manner that it branches into each row and semiconductor ICs 11a in quantities of q and PTC elements 22a connected in series to the semiconductor ICs 11a are connected in parallel to the common voltage or current supply line 25a, the trip current of the PTC elements 22a is denoted by I [A]. In this case, it is necessary for a master power supply that performs supply to the common voltage or current supply line 25a to have a maximum of the current carrying capacity given by:

$$q \times I \text{ [A]} \qquad \text{Formula 1}$$

According to the present invention, however, if the current flowing through a conforming product of the semiconductor IC 11a is denoted by i [A], a maximum of the current carrying capacity given by the following formula is sufficient:

$$(q-1) \times i + I \text{ [A]} \qquad \text{Formula 2}$$

As a matter of course, the current i of a conforming product of the semiconductor IC 11a is smaller than the trip current I of the PTC element 22a.

Lastly, wafer-level burn-in is performed together, with the PTC elements 22a of DC-defective semiconductor ICs 11a of the whole semiconductor wafer 10a kept in a trip state.

As described above, by applying a voltage to each of the PTC elements connected to semiconductor ICs in order, the PTC elements connected to all DC-defective semiconductor ICs are tripped before wafer-level burn-in is performed, and by using a given time before the PTC elements return to a steady state, wafer-level burin-in can be performed together, with the PTC elements connected to all DC-defective semiconductor ICs kept in a trip state. This enables the PTC elements to be positively tripped for the DC defects of the semiconductor ICs during the wafer-level burn-in and it is possible to increase the reliability of the wafer-level burn-in.

Embodiment 2

However, as described earlier, due to the recent scale down design of semiconductors, the current i of conforming products tends to increase, and a current at a high voltage has often become so large that this current has been confused with a current due to a DC defect.

This embodiment is an inspection method to be adopted when the amount of current in a conforming product is large as described above and it is difficult to distinguish this amount of current from the amount of current in the case of a DC defect. This embodiment will be described with reference to FIG. 4.

Figure 4:
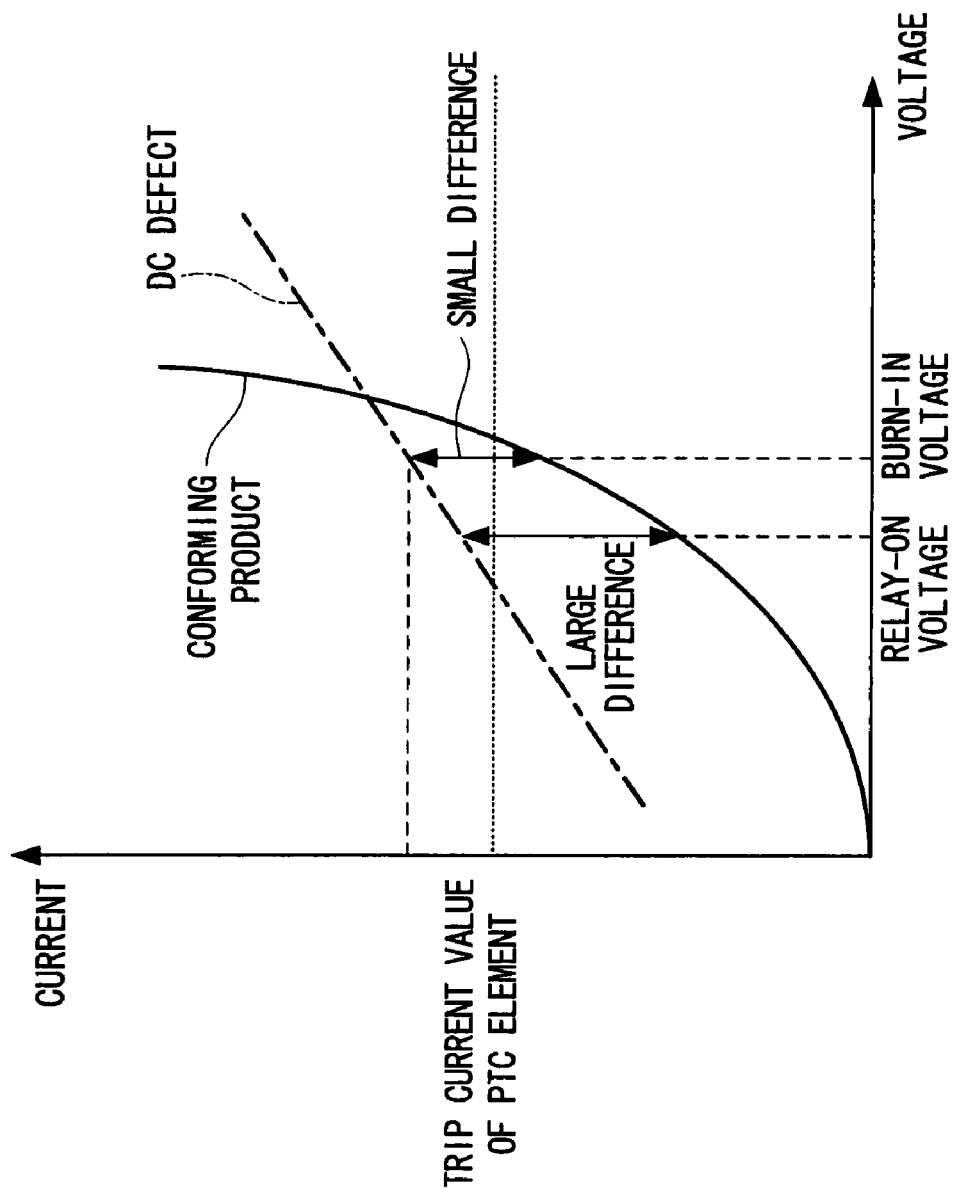
FIG. 4 is a diagram that shows the current-voltage characteristic of a semiconductor IC.

FIG. 4 is a diagram that shows the current-voltage characteristic of a semiconductor IC.

As shown in FIG. 4, in general, the current of a semiconductor IC, particularly a MOS IC is proportional to the square of voltage. In contrast to this, the current of a semiconductor IC containing a defect, such as a short circuit, through which a large amount of current flows, is often linearly proportional to voltage, as observed in the resistance of metals. For this reason, at the level of a general burn-in voltage, it can be said that the lower the voltage, the larger the difference in the amount of current between a conforming product and a DC-defective product at the same voltage.

By taking advantage of this characteristic, the voltage applied to the common voltage or current supply line with the relay on is made a little lower than a usually used burn-in voltage in the PTC element trip step before wafer-level burn-in described in Embodiment 1, it is possible to increase the difference in the amount of current between a DC-defective product and a conforming product and the distinction between the defective product and the conforming product can be made clear. As a result of this, the trip current value can be set with sufficient margins.

The tripped PTC element does not return to a steady state later even when the voltage is raised to a burn-in voltage during wafer-level burn-in and it is possible to cut, in a stable manner, the voltage of a defective semiconductor IC through which a large amount of current flows.

At this time, a decrease in voltage can also be realized by reducing the amount of current applied.

As described above, in tripping the PTC elements in Embodiment 1, a voltage lower than the burn-in voltage is applied. This enables the trip current of the PTC elements to flow positively and the PTC elements to be positively tripped for the DC defects of the semiconductor ICs during the wafer-level burn-in and it is possible to increase the reliability of the wafer-level burn-in.

The relays can be operated positively by being turned on one by one. However, in some characteristics of a semiconductor IC, the same effect can be obtained by turning on a plurality of relays at a time.

Embodiment 3

Furthermore, in a semiconductor IC, particularly a MOS IC, under the burn-in conditions an off-leak current appears and the current i tends to increase. In association with this, a current at a high temperature has often become so large that this current has been confused with a current due to a DC defect.

This embodiment is an inspection method to be adopted when the amount of current in a conforming product is large as described above due to the presence of a high-temperature atmosphere and it is difficult to distinguish this amount of current from the amount of current in the case of a DC defect. This embodiment will be described with reference to FIG. 5.

Figure 5:
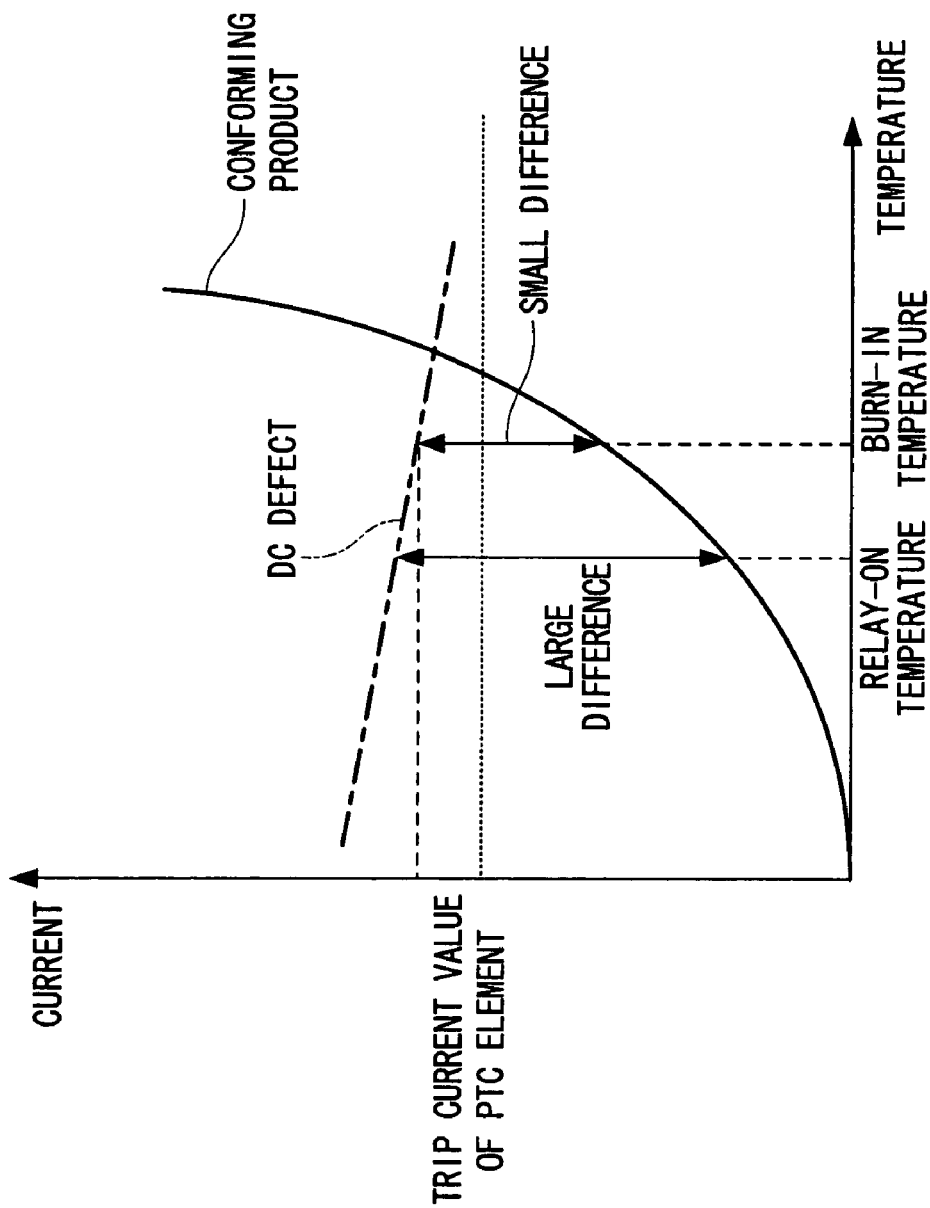
FIG. 5 is a diagram that shows the current-temperature characteristic of a semiconductor IC.

FIG. 5 is a diagram that shows the current-temperature characteristic of a semiconductor IC.

As shown in FIG. 5, in general, the off-leak current of a semiconductor IC, particularly a MOS IC changes exponentially with respect to temperature. In contrast to this, the current of a semiconductor IC containing a defect, such as a short circuit, through which a large amount of current flows, often exhibits linear, negative changes with respect to temperature, as observed in the resistance of metals. For this reason, at the level of a general burn-in temperature, the lower the temperature, the larger the difference in the amount of current between a conforming product and a DC-defective product at the same temperature.

By taking advantage of this characteristic, the temperature used with the relay on is made lower than a usually used burn-in temperature in the PTC element trip step before wafer-level burn-in described in Embodiment 1, whereby it is possible to increase the difference in the amount of current between a defective product and a conforming product and the distinction between the DC-defective product and the conforming product can be made clear. As a result of this, the trip current value can be set with sufficient margins.

The tripped PTC element does not return to a steady state later even when the temperature is raised to a burn-in temperature during wafer-level burn-in and it is possible to cut, in a stable manner, the voltage of a defective semiconductor IC through which a large amount of current flows.

As described above, in tripping the PTC elements in Embodiment 1, the voltage is applied at a temperature lower than the burn-in temperature. This enables the trip current of the PTC elements to flow positively and the PTC elements to be positively tripped for the DC defects of the semiconductor ICs during the wafer-level burn-in and it is possible to increase the reliability of the wafer-level burn-in.

The relays can be operated positively by being turned on one by one. However, with some characteristics of a semiconductor IC, the same effect can be obtained by turning on a plurality of relays at a time.

Embodiment 4

Embodiment 4 of the present invention is a semiconductor inspection apparatus and a semiconductor IC inspection method in a case where semiconductor ICs have a plurality of power supplies, and will be described in detail with reference to FIG. 2.

Figure 2:
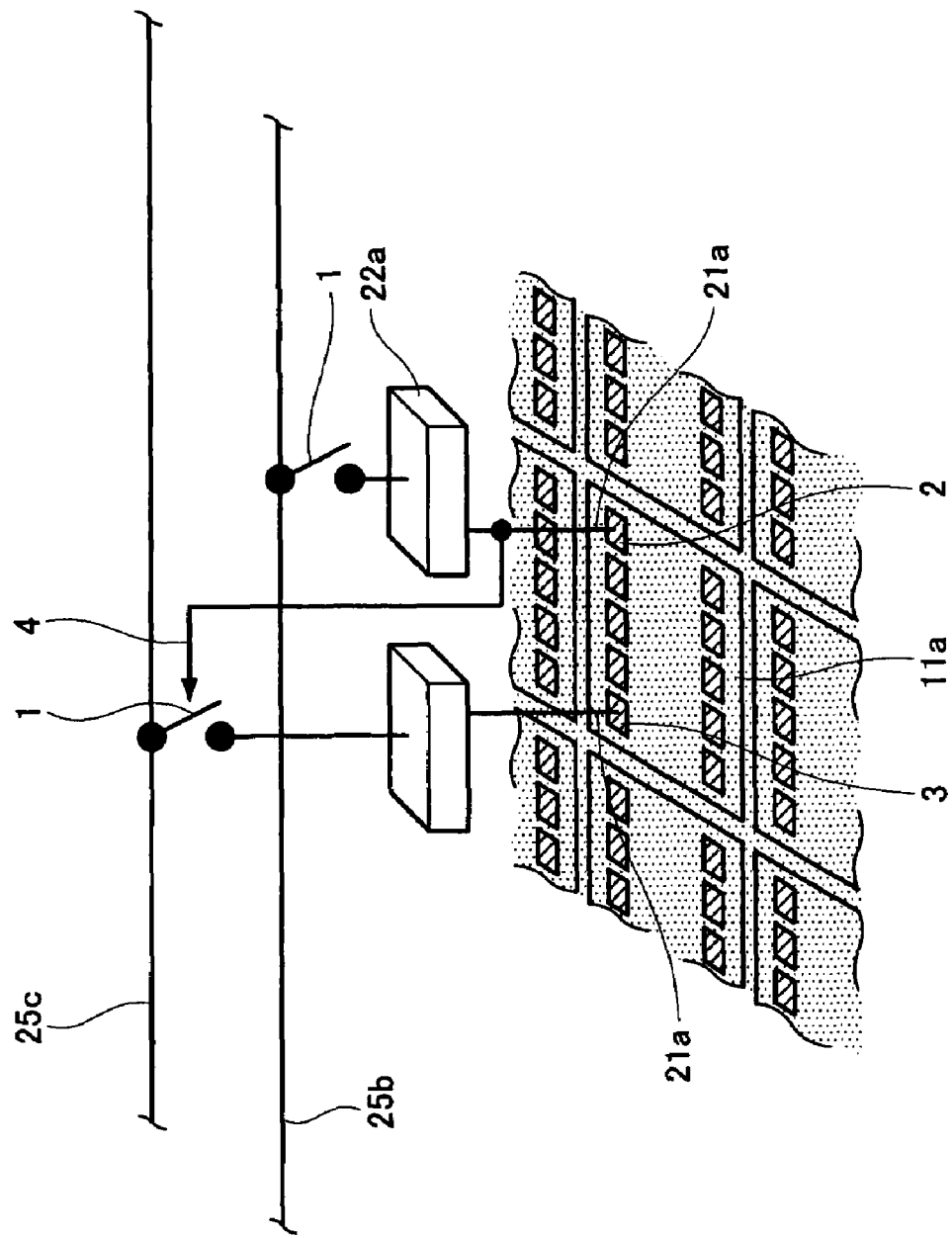
FIG. 2 is a diagram explaining a semiconductor inspection apparatus in Embodiment 4 of the present invention.

FIG. 2 is a diagram explaining a semiconductor inspection apparatus in Embodiment 4.

In FIG. 2, the reference numeral 1 denotes a relay or relay circuit in Embodiment 4 of the present invention. Two relays or relay circuits 1 are provided, one being connected to a voltage or current supply line 25b and the other being connected to a voltage or current supply line different from a voltage or current supply line 25c.

In FIG. 2, an inspection power-supply electrode 3 is different from an inspection power-supply electrode 2. The inspection power-supply electrode 3 and the inspection power-supply electrode 2 are each connected in series to the relay or relay circuit 1 via a PTC element 22a. The reference numeral 4 denotes a relay control signal. The relay control signal 4 is a control signal that is output from between the PTC element 22a connected to the supply line 25b and a power-supply electrode of the inspection power-supply electrode 2, and controls the relay or relay circuit 1 connected to the supply line 25c. In this embodiment, the relay or relay circuit 1 connected to the supply line 25c is turned on when the relay control signal 4 is at a theoretical "H" level.

The inspection method in the present invention will be described below.

First, the relay or relay circuit 1 connected to the supply line 25b of FIG. 2 is turned on.

Next, in the same way as in Embodiment 1 to Embodiment 3, when a voltage is applied to the supply line 25b from an unillustrated burn-in apparatus in order to trip PTC element 22a before wafer-level burn-in, the applied voltage is applied to the inspection power-supply electrode 2 of a semiconductor IC 11a via the voltage or current supply line 25b, the relay or relay circuit 1, the PTC element 22a and the probe terminal 21a.

At this time, when an abnormally large amount of current flows through the semiconductor IC 11a due to a DC defect and the like, a large amount of current flows also through the PTC element 22a, the temperature of this PTC element 22a rises to a high level and the resistance value of the PTC element 22a rises remarkably (a trip state). Therefore, the voltage is not applied to the DC-defective semiconductor IC 11a any more. Because the voltage between this PTC element 22a and the inspection power-supply electrode 3 is not applied, the relay or relay circuit 1 of the supply line 25c maintains an off condition and it is possible to cut the inspection power-supply electrode 3 simultaneously with the inspection power-supply electrode 2.

Needless to say, the same operation occurs even when the control relationship between the relay or relay circuit 1 connected to the supply line 25b and the supply line 25c and the relay control signal is reverse.

If the semiconductor IC 11a is a conforming product, the voltage of the supply line 25b is normally transmitted to the inspection power-supply electrode 2 via the relay or relay circuit 1 and the PTC element 22*a*. Therefore, the relay or relay circuit 1 connected to the supply line 25*c* is simultaneously turned on and can transmit the voltage to the inspection power-supply electrode 3.

In this embodiment, the description was given of the operation of one semiconductor IC 11*a*. However, the same description applies to a case where as in Embodiment 1, a plurality of semiconductor ICs 11*a* are connected. Also, the present invention is applicable to a case where the number of power supplies is at least 3, by converting an output value from one PTC element into a control signal of a relay connected to a supply line in another power supply.

Also in this embodiment, by carrying out an inspection method similar to those of Embodiments 2 and 3, it is possible to more positively trip the PTC element.

As described above, when there are provided a plurality of operating power supplies in the semiconductor ICs in Embodiment 1 to Embodiment 3, an output value from one PTC element is converted into a control signal of a relay connected to a supply line in another power supply and when this PTC element is in a trip state, control is performed so that a relay connected to a supply line in another power supply is turned off, whereby at the instant when this PTC element has come to a trip state, it is possible to stop the power supply to the supply line in the other power supply.

Embodiment 5

Embodiment 5 of the present invention is a semiconductor inspection apparatus and a semiconductor IC inspection method in a case where semiconductor ICs have an inspection power-supply electrode and an inspection signal electrode, and will be described in detail with reference to FIG. 3.

Figure 3:
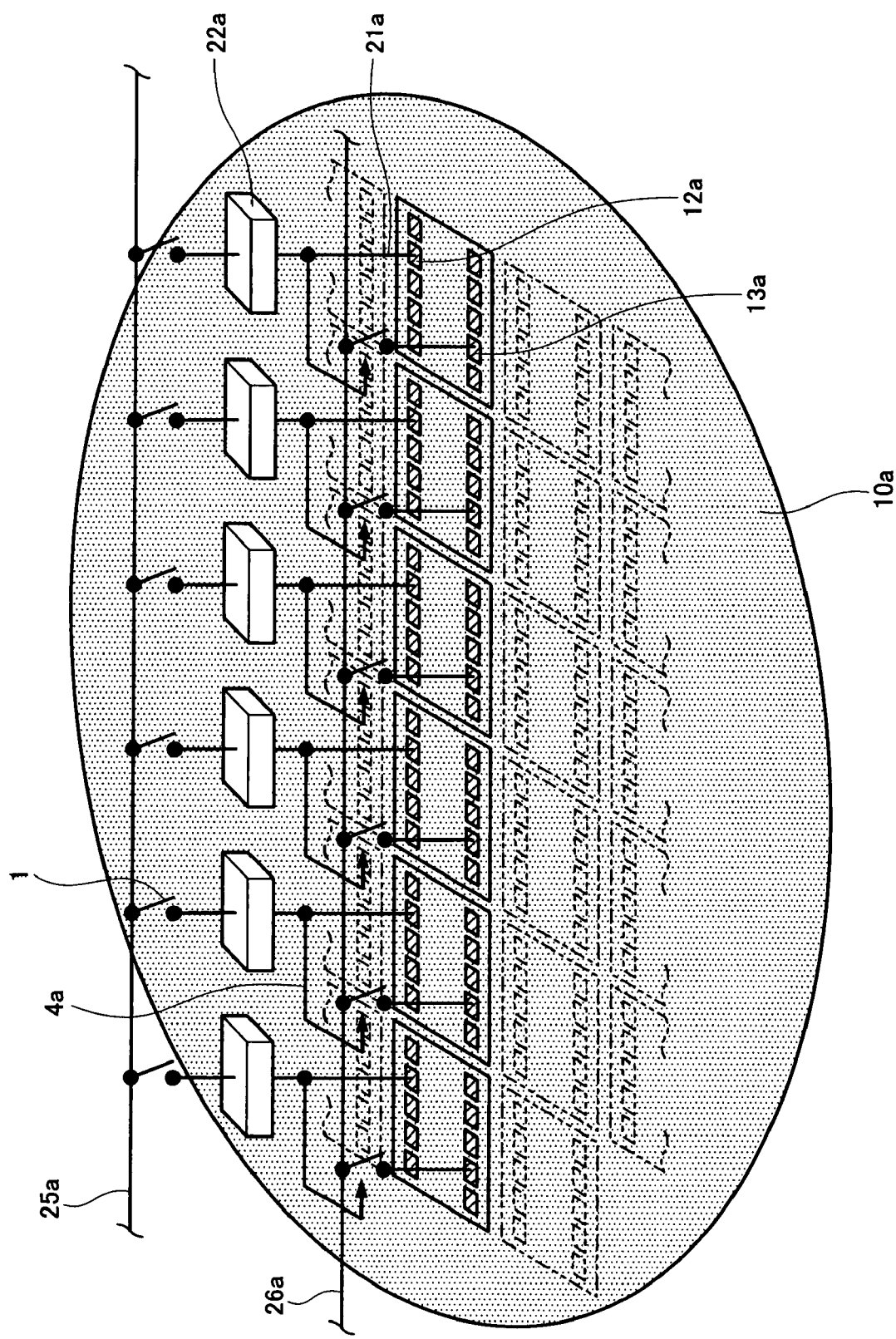
FIG. 3 is a diagram explaining a semiconductor inspection apparatus in Embodiment 5 of the present invention.

FIG. 3 is a diagram explaining a semiconductor inspection apparatus in Embodiment 5.

In FIG. 3, the reference numeral 1 denotes a relay or relay circuit in Embodiment 5 of the present invention, which is connected to a common voltage or current supply line 25*a* and a common signal supply line 26*a*.

In the figure, the reference numeral 12*a* denotes an inspection power-supply electrode, which is connected in series to the relay or relay circuit 1 via a PTC element 22*a*. The reference numeral 13*a* denotes an inspection signal electrode, which is connected to the common signal supply line 26*a* via the relay or relay circuit 1. A relay control signal 4*a* that controls the relay or relay circuit 1, which connects the inspection signal electrode 13*a* and the common signal supply line 26*a*, is a control signal that controls the relay or relay circuit 1 connected to the common signal supply line 26*a* from between the PTC element 22*a* and the inspection power-supply electrode 12*a*. In this embodiment, the relay or relay circuit 1 of the common signal supply line 26*a* is turned on when the relay control signal 4 is at a theoretical "H" level.

The inspection method in the present invention will be described below.

First, the relay or relay circuit 1 connected to the supply line 25*a* of FIG. 3 is turned on.

Next, in the same way as in Embodiment 1 to Embodiment 3, when a voltage is applied to the supply line 25*a* from an unillustrated burn-in apparatus in order to trip PTC element 22*a* before wafer-level burn-in, the applied voltage is applied to the inspection power-supply electrode 12*a* of a semiconductor IC 11*a* via the common voltage or current supply line 25*a*, the relay or relay circuit 1, the PTC element 22*a* and the probe terminal 21*a*.

At this time, when an abnormally large amount of current flows through the semiconductor IC 11*a* due to a DC defect and the like, a large amount of current flows also through the PTC element 22*a*, the temperature of this PTC element 22*a* rises to a high level and the resistance value of the PTC element 22*a* rises remarkably (a trip state). Therefore, the voltage is not applied to the defective semiconductor IC 11*a* any more. Because the voltage between this PTC element 22*a* and the inspection power-supply electrode 2 is not applied, the relay or relay circuit 1 connected to the supply line 26*a* maintains an off condition and it is possible to cut the inspection signal electrode 13*a* simultaneously with the inspection power-supply electrode 12*a*.

Needless to say, the same operation occurs even when the control relationship between the relay or relay circuit 1 connected to the supply line 25*a* and the supply line 26*a* and the relay control signal is reverse.

If the semiconductor IC 11*a* is a conforming product, the voltage of the supply line 25*a* is normally transmitted to the inspection power-supply electrode 12*a* via the relay or relay circuit 1 and the PTC element 22*a*. Therefore, the relay or relay circuit 1 abutting against the inspection signal electrode 13*a* is simultaneously turned on and can transmit the signal to the inspection signal electrode 13*a*.

In this embodiment, the description was given of the operation of one semiconductor IC 11*a*. However, the same description applies to a case-where as in Embodiment 1 a plurality of semiconductor ICs 11*a* are connected.

Also in this embodiment, the PTC element can be positively tripped by carrying out the same inspection method as in Embodiments 2 and 3.

As described above, in a case where one or more inspection signal electrodes are provided in addition to the inspection power-supply electrode in the semiconductor ICs of Embodiments 1 to 3, an output value from a PTC element connected to the inspection power-supply electrode is converted into a control signal for a relay connected to the inspection signal electrode and control is performed so that the relay connected to the inspection signal electrode is turned off when this PTC element is in a trip state, whereby the signal input to the inspection signal electrode can be stopped at the instant when this PTC element has come to the trip state.

Embodiment 6

The above description was given of a case where the power supply to a DC-defective semiconductor IC is stopped in burn-in in the wafer condition. However, as in each of Embodiments 1 to 5, it is also possible to stop the power supply to a DC-defective semiconductor IC when package burn-in of semiconductor ICs after packaging is performed together on a burn-in board.

Figure 6:
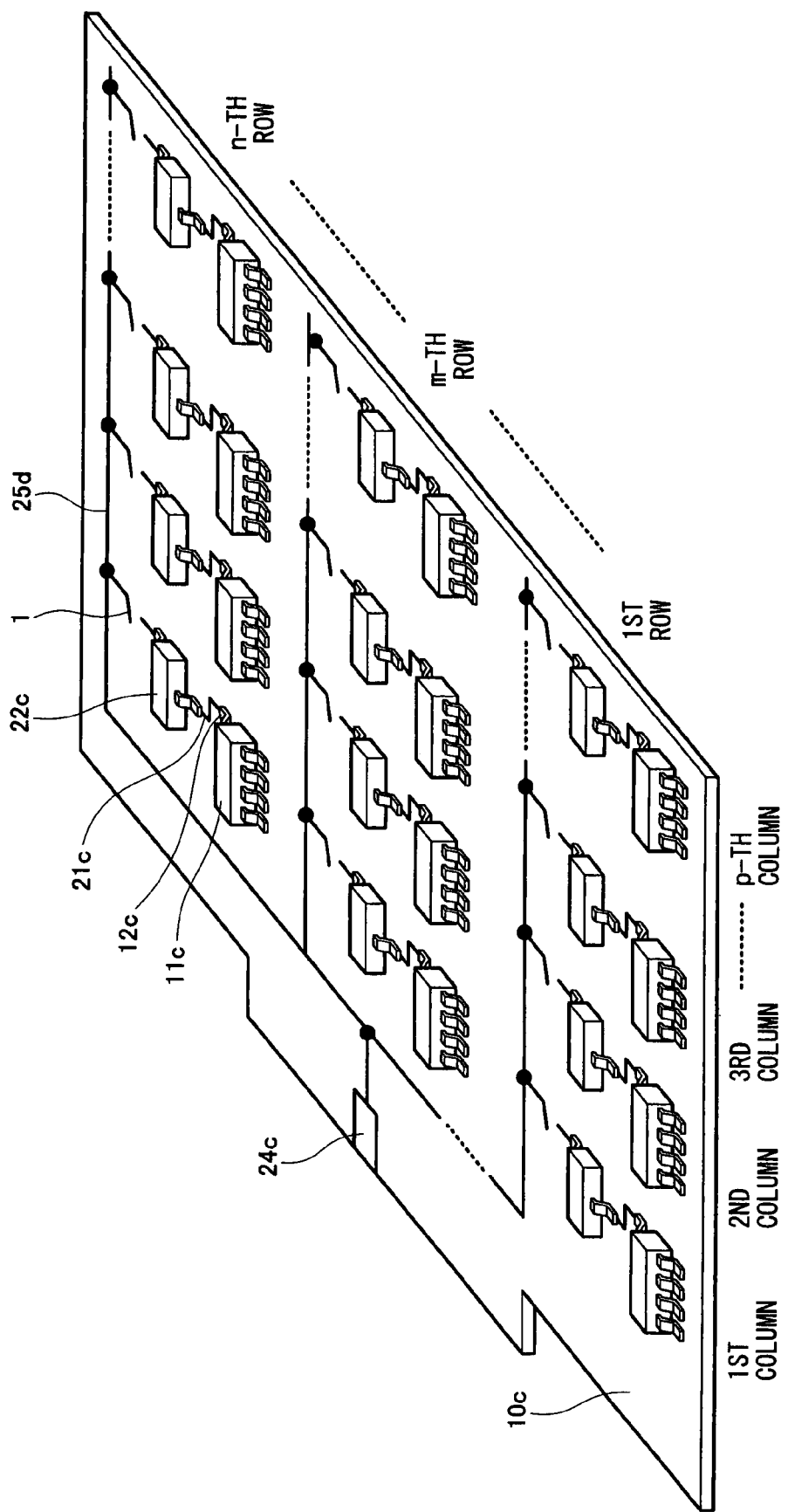
FIG. 6 is a diagram explaining a semiconductor inspection apparatus in Embodiment 6 of the present invention.

Embodiment 6 of the present invention relates to a PTC element and a relay on a burn-in board and will be described in detail with reference to FIG. 6. This arrangement is such that the probe card in Embodiment 1 is replaced with a burn-in board. FIG. 6 is a diagram that shows the connected condition of a semiconductor inspection apparatus in Embodiment 6 of the present invention.

In FIG. 6, the reference numeral 22*c* denotes a PTC element, the reference numeral 24*c* denotes an external electrode, and the reference numeral 25*d* denotes a common voltage or current supply line. This arrangement is the same as the plane structure of the rear surface of a probe card in a conventional technique. The reference numeral 10*c* denotes a burn-in board, the reference numeral 11*c* denotes a mounted semiconductor IC, and the reference numeral 12*c* denotes an inspection power-supply electrode. And the reference numeral 1 denotes a relay or relay circuit related to the present invention.

The relay or relay circuit 1 is connected in parallel to the common voltage or current supply line 25d, and the PTC element 22c is connected in series to the relay or relay circuit 1 and to the inspection power-supply electrode 12c via a board interconnect 21c. Although in FIG. 6 the relay or relay circuit 1 is connected between the PTC element 22c and the voltage or current supply line 25d, the relay or relay circuit 1 may also be connected between the PTC element 22c and each of the board interconnects 21c.

In the example of FIG. 6, the common voltage or current supply line 25d is supplied from the external electrode 24c and branches into a plurality of supply lines connected to the semiconductor IC 11c in each row.

The above description was given of an arrangement in which a relay or relay circuit 1 is provided for each of the inspection power-supply electrodes 12c and each of the relays or relay circuits 1 can be on-off controlled. However, it is not always necessary that the relay or relay circuit 1 and the PTC element 22c are formed for all of the inspection power-supply electrodes 12c, and the arrangement may be such that the relay or relay circuit 1 and the PTC element 22c are formed in a minimum number of inspection power-supply electrodes 12c necessary for stopping operation.

A semiconductor IC inspection method in the present invention will be described below.

First, before burn-in is performed, a PTC element 22c connected to a DC-defective semiconductor IC 11c is tripped.

At the start, with attention paid to the m-th row in FIG. 6, the relay or relay circuit 1 in the m-th row, first column is turned on.

When in this state a voltage is applied to the external electrode 24c from an unillustrated burn-in apparatus in order to start package burn-in, the applied voltage is applied to the inspection power-supply electrode 12c of the semiconductor IC 11c in the m-th row, first column via the common voltage or current supply line 25d, the relay or relay circuit 1, the PTC element 22c and the board interconnect 21c.

At this time, if a DC defect is present in the semiconductor IC 11c, an abnormally large amount of current flows. Therefore, a large amount of current flows also through the connected PTC element 22c and the temperature of this PTC element 22c rises to a high level. The PTC element 22c comes to a trip state and the resistance value thereof rises remarkably. As a result, the voltage is not applied to the DC-defective semiconductor IC 11c any more. In contrast to this, when the semiconductor IC 11c is a conforming product, the PTC element 22c maintains the connection at low resistance and it is possible to apply the voltage, with the relay or relay circuit 1 kept on in a normal condition.

Next, the relay in the m-th row, second column is turned on.

In this state a voltage is applied to the external electrode 24c. If an abnormally large amount of current flows through the semiconductor IC 11c due to a DC defect and the like, a large amount of current flows also through the PTC element 22c, the temperature of this PTC element 22c rises to a high level and the resistance value of the PTC element 22c increases remarkably. As a result, the voltage is not applied to the defective semiconductor IC 11c any more. When the semiconductor IC 11c is a conforming product, the PTC element 22a maintains the connection at low resistance and it is possible to apply the voltage, with the relay or relay circuit 1 kept on in a normal condition.

By similarly carrying out the package burn-in to the p-th column, the semiconductor ICs 11c can be checked for a DC defect. The trip state is maintained until the temperature of the PTC element 22c drops, and when in this state the many packages burn-in is carried out, defective semiconductor ICs 11c in the whole m-th row, through which an abnormally large amount of current flows, can be shut off from the common voltage or current supply line.

Furthermore, by similarly performing voltage application also to each row, it is possible to bring the PTC elements 22c of semiconductor ICs 11c, which are DC defective on the whole burn-in board 10c, into a trip state.

It is also possible to stop the power supply to a DC-defective semiconductor IC 11c only by use of a relay without using the PTC element 22c. However, even when a DC-defective semiconductor IC 11c could be detected, it is necessary to disconnect the relay for the DC-defective semiconductor IC 11c during burn-in. In contrast to this, because the PTC element 22c is connected, the voltage is not applied to the DC-defective semiconductor IC 11c any more without the need to disconnect the relay while the PTC element 22c is in a trip condition.

With conventional semiconductor inspection apparatus, in a case where there are many DC-defective semiconductor ICs 11c, when a voltage is applied at a time to the whole burn-in board 10c or the whole row, the current is sometimes insufficient for tripping the PTC element 22c of each of the DC-defective semiconductor ICs 11c. In the present invention, however, a voltage is applied to the semiconductor ICs 11c one by one and the PTC element 22c of a DC-defective semiconductor IC 11c is tripped, whereby it is possible to reduce the supply capacity of the common power supply for tripping the PTC element. Instead of applying a voltage to the semiconductor ICs 11c one by one, it is also possible to apply a voltage to each of a plurality of semiconductor ICs 11c within the range of the supply capacity of the common power supply for tripping the PTC elements 22c.

For example, in a case where the common voltage or current supply line 25d is wired in such a manner that it branches into each row and semiconductor ICs 11c in quantities of q and PTC elements 22c connected to the semiconductor ICs 11c in series are connected to the common voltage or current supply line 25d in parallel, the trip current of the PTC elements 22c is denoted by I [A]. In this case, it is necessary for a master power supply that performs supply to the common voltage or current supply line 25d to have a maximum of the current carrying capacity given by:

$$q \times I \; [A] \qquad \text{Formula 3}$$

According to the present invention, however, if the current flowing through a conforming product of the semiconductor IC 11c is denoted by i [A], a maximum of the current carrying capacity given by the following formula is sufficient:

$$(q-1)-i+I \; [A] \qquad \text{Formula 4}$$

As a matter of course, the current i of a conforming product of the semiconductor IC 11c is smaller than the trip current I of the PTC element 22c.

Lastly, burn-in is performed together, with the PTC elements 22c of DC-defective semiconductor ICs 11c on the whole burn-in board 10c kept in a trip condition.

As described above, by applying a voltage to each of the PTC elements connected to semiconductor ICs in order, the PTC elements connected to all DC-defective semiconductor ICs are tripped before burn-in is performed, and by using a given time before the PTC elements return to a steady state, burn-in can be performed together, with the PTC elements connected to all DC-defective semiconductor ICs kept in a trip condition. This enables the PTC elements to be positively tripped for the DC defects of the semiconductor ICs during the package burn-in and it is possible to increase the reliability of the package burn-in.

This is the same effect as that obtained in Embodiment 1 of wafer-level burn-in.

Embodiment 7

However, as described earlier, due to the recent scale down design of semiconductors, the current i of conforming products tends to increase, and a current at a high voltage has often become so large that this current has been confused with a current due to a DC defect.

This embodiment is an inspection method to be adopted when the amount of current in a conforming product is large as described above and it is difficult to distinguish this amount of current from the amount of current in the case of a DC defect. This embodiment will be described with reference to FIG. 4.

As shown in FIG. 4, in general, the current of a semiconductor IC, particularly a MOS IC is proportional to the square of voltage. In contrast to this, the current of a semiconductor IC containing a defect, such as a short circuit, through which a large amount of current flows, is often linearly proportional to voltage, as observed in the resistance of metals. For this reason, at the level of a general burn-in voltage, it can be said that the lower the voltage, the larger the difference in the amount of current between a conforming product and a DC-defective product at the same voltage.

By taking advantage of this characteristic, the voltage applied to the common voltage or current supply line with the relay on is made a little lower than a usually used burn-in voltage in the PTC element trip step before burn-in described in Embodiment 6, whereby it is possible to increase the difference in the amount of current between a defective product and a conforming product and the distinction between the defective product and the conforming product can be made clear. As a result of this, the trip current value can be set with sufficient margins.

The tripped PTC element does not return to a steady state later even when the voltage is raised to a burn-in voltage during burn-in and it is possible to cut, in a stable manner, the voltage of a defective semiconductor IC through which a large amount of current flows.

At this time, a decrease in voltage can also be realized by reducing the amount of current applied.

As described above, in tripping the PTC elements in Embodiment 6, a voltage lower than the burn-in voltage is applied. This enables the trip current of the PTC elements to flow positively and the PTC elements to be positively tripped for the DC defects of the semiconductor ICs during the package burn-in and it is possible to increase the reliability of the package burn-in.

The relays can be operated positively by being turned on one by one. However, with some characteristics of a semiconductor IC, the same effect can be obtained by turning on a plurality of relays at a time.

This is the same effect as that obtained in Embodiment 1 of wafer-level burn-in.

In the same way as in Embodiments 6 and 7, the relay or relay circuit and the PTC element formed between the probe terminal of the probe card and the supply line are formed between the board interconnect of the burn-in board and the supply line, whereby the content of the Embodiments 3 to 5 of wafer-level burn-in can also be carried out in package burn-in and the same effect can be obtained.

What is claimed is:

1. A semiconductor inspection apparatus for performing wafer level burn-in for a plurality of semiconductor ICs, each semiconductor IC having a plurality of electrodes that input and output a signal or a power-supply voltage or a grounding voltage and are formed on a wafer, the semiconductor inspection apparatus comprising:
   a plurality of probes for performing inspection by connecting to each electrode of each semiconductor IC;
   a plurality of signal interconnects for inputting and outputting, via the plurality of probes, a signal to and from a signal electrode of each semiconductor IC;
   a power-supply interconnect for supplying, via the plurality of probes, a power-supply voltage to each power-supply electrode of each semiconductor IC;
   a grounding interconnect for supplying, via the plurality of probes, a grounding voltage to each grounding electrode of each semiconductor IC;
   a relay located between the power-supply interconnect and at least one of the power-supply electrodes; and
   a PTC element that located between the relay and the power-supply electrode,
   wherein a high voltage is applied to each of the semiconductor ICs, with the relay brought into a connected condition, and the burn-in is performed, with the PTC element tripped for all of the semiconductor ICs that have been proven to be defective, so that the relay is capable of being turned on while burn-in is performed.

2. A semiconductor inspection apparatus for performing wafer level burn-in for a plurality of semiconductor ICs, each semiconductor IC having a plurality of electrodes for inputting or outputting one of a signal, a power-supply voltage, or a ground voltage, each semiconductor IC formed on a wafer, the semiconductor inspection apparatus comprising:
   a plurality of probes for performing inspection, said probes being connected to each of the electrodes of each of the semiconductor ICs;
   a plurality of signal interconnects for inputting and outputting, via the plurality of probes, a signal to and from a signal electrode of each semiconductor IC;
   a power-supply interconnect for supplying, via the plurality of probes, a power-supply voltage to each of the power-supply electrodes of each of the semiconductor ICs;
   a grounding interconnect for supplying, via the plurality of probes, a ground voltage to each of the ground electrodes of each semiconductor IC;
   a relay located between the power-supply interconnect and at least one of the power-supply electrodes;
   a PTC element located between the relay and the power-supply electrode; and
   a signal relay located between the signal interconnect and each signal electrode, the signal relay for receiving an output from the PTC element as a control signal;
   wherein a high voltage can be applied to each semiconductor IC when the relay is in a connected position and burn-in is performed, the PTC element being tripped for each semiconductor IC that is determined to be defective, and
   wherein the signal relay and the PTC element are connected to the same semiconductor IC.

3. A semiconductor inspection apparatus for performing wafer level burn-in for a plurality of semiconductor ICs, each semiconductor IC being located on a wafer and having a plurality of electrodes that input and output a signal or a power-supply voltage or a grounding voltage, the semiconductor inspection apparatus comprising:

a plurality of probes for performing inspection by being connected to each electrode of each of the semiconductor ICs;

a plurality of signal interconnects for inputting and outputting, via the plurality of probes, a signal to and from a signal electrode of each semiconductor IC;

a plurality of power-supply interconnects for supplying, via the plurality of probes, a power-supply voltage corresponding to each power-supply electrode of each semiconductor IC;

a grounding interconnect for supplying, via the plurality of probes, a grounding voltage to each grounding electrode of each semiconductor IC;

a relay located between the power-supply interconnect and at least one of the power-supply electrodes; and a PTC element located between the relay and the power-supply electrode, wherein a first relay connected to the power-supply electrode corresponding to a first power-supply voltage is for receiving a control signal from outside the semiconductor inspection apparatus, an a second relay connected to a power-supply electrode corresponding to a second power-supply voltage is for receiving an output signal of the PTC element corresponding to the first power-supply voltage, a high voltage is applied to each semiconductor IC, with the relay that is connected to the power-supply electrode corresponding to the first power-supply voltage brought into a connected condition, and the burn-in is performed, with the PTC element tripped for each semiconductor IC that has been proven to be defective.

4. A semiconductor inspection apparatus on which a plurality of semiconductor ICs having a plurality of electrodes that input and output a signal or a power-supply voltage or a grounding voltage are mounted, and which performs wafer level burn-in for the semi conductor ICs, the semiconductor inspection apparatus comprising:

a plurality of board interconnect terminals for performing inspection by being connected to each of the electrodes of each of the semiconductor ICs;

a plurality of signal interconnects for inputting and outputting a signal, via the board interconnect terminal, to and from the signal electrodes of each semiconductor IC;

a power-supply interconnect for supplying a power-supply voltage, via the board interconnect terminal, to each power-supply electrode of each semiconductor IC;

a grounding interconnect for supplying a ground voltage, via the board interconnect terminal, to each grounding electrode of each semiconductor IC;

a relay located between the power-supply interconnect and at least one of the power-supply electrodes; and a PTC element located between the relay and the power-supply electrode, wherein a high voltage can be applied to each semiconductor IC, with the relay brought into a connected condition, and the burn-in is performed, the PTC element being tripped for each semiconductor IC that has been proven to be defective, the relay being capable of being turned on during the burn-in.

5. A semiconductor inspection apparatus having a plurality of semiconductor ICs mounted thereon, each semiconductor IC having a plurality of electrodes, including at least one of input/output, power-supply voltage, or ground electrodes. the semiconductor inspection apparatus for performing wafer level burn-in for the plurality of semiconductor ICs, the semiconductor inspection apparatus comprising;

a plurality of board interconnect terminals for performing inspection, said board interconnect terminals each being connected to a respective electrode of a respective semiconductor IC;

a plurality of signal interconnects for inputting and outputting, via the plurality of board interconnect terminals, a signal to and from a signal electrode of each semiconductor IC;

a power-supply interconnect for supplying, via the plurality of board interconnect terminals, a power-supply voltage to each power-supply electrode of each semiconductor IC;

a grounding interconnect for supplying, via the plurality of board interconnect terminals, a ground voltage to each of the ground electrodes of each semiconductor IC;

a relay located between the power-supply interconnect and at least one of the power-supply electrodes;

a PTC element located between the relay and the power-supply electrode; and a signal relay located between the signal interconnect and a signal electrode, the signal relay for receiving an output from the PTC element as a control signal;

wherein a high voltage can be applied to each semiconductor IC when the relay is in a connected position and burn-in is performed, the PTC element being tripped for each semiconductor IC that is determined to be defective, and wherein a the signal relay and the PTC element are connected to the same semiconductor IC.

* * * * *